United States Patent
Kleinsorge et al.

(10) Patent No.: US 9,762,194 B2
(45) Date of Patent: Sep. 12, 2017

(54) HIGH-FREQUENCY TRANSMITTER, WIRELESS MICROPHONE AND GUITAR TRANSMITTER OR POCKET TRANSMITTER

(71) Applicant: Sennheiser electronic GmbH & Co. KG, Wedemark (DE)

(72) Inventors: Mathias Kleinsorge, Wedemark (DE); Christian Budnik, Hannover (DE)

(73) Assignee: Sennheiser electronic GmbH & Co. KG, Wedemark (DE)

( * ) Notice: Subject to any disclaimer, the term of this patent is extended or adjusted under 35 U.S.C. 154(b) by 88 days.

(21) Appl. No.: 14/380,296

(22) PCT Filed: Feb. 28, 2013

(86) PCT No.: PCT/EP2013/053995
§ 371 (c)(1),
(2) Date: Aug. 21, 2014

(87) PCT Pub. No.: WO2013/127898
PCT Pub. Date: Sep. 6, 2013

(65) Prior Publication Data
US 2015/0303886 A1 Oct. 22, 2015

(30) Foreign Application Priority Data
Feb. 28, 2012 (DE) .................. 10 2012 203 026

(51) Int. Cl.
*H03G 3/00* (2006.01)
*H04B 1/04* (2006.01)
(Continued)

(52) U.S. Cl.
CPC .............. *H03G 3/00* (2013.01); *H03F 3/181* (2013.01); *H03F 3/20* (2013.01); *H03G 3/3042* (2013.01);
(Continued)

(58) Field of Classification Search
CPC ........ H03G 3/00; H03G 3/3042; H03F 3/181; H03F 3/20; H04B 1/0458; H04B 1/0475; H04B 2001/0416
(Continued)

(56) References Cited

U.S. PATENT DOCUMENTS

| 5,311,143 A | 5/1994 | Soliday |
| 5,420,552 A | 5/1995 | Säkkä |

(Continued)

FOREIGN PATENT DOCUMENTS

| DE | 103 40 808 | 3/2005 |
| GB | 2 369 734 | 6/2002 |

(Continued)

OTHER PUBLICATIONS

International Search Report for Application No. PCT/EP2013/053995 dated Aug. 9, 2013.
(Continued)

*Primary Examiner* — David Ton
(74) *Attorney, Agent, or Firm* — Haug Partners LLP

(57) ABSTRACT

There is provided a high-frequency HF transmitter for wireless microphones, guitar transmitters or pocket transmitters. The transmitter has at least one antenna, a power amplifier for amplifying a high-frequency audio signal, an interference signal detection unit for detecting an interference signal coupled in by way of the antenna, a power detector at the output of the detection unit for detecting the power of the interference signals detected by the interference signal detection unit and an operating point regulating unit for adjusting the operating point power of the power amplifier in dependence on the power of the output signals, that is detected by the power detector.

9 Claims, 8 Drawing Sheets

(51) Int. Cl.
*H03G 3/30* (2006.01)
*H03F 3/181* (2006.01)
*H03F 3/20* (2006.01)

(52) U.S. Cl.
CPC ......... *H04B 1/0458* (2013.01); *H04B 1/0475* (2013.01); *H04B 2001/0416* (2013.01)

(58) Field of Classification Search
USPC .......... 455/126, 127.1, 127.2, 127.5, 91, 95, 455/115.1
See application file for complete search history.

(56) References Cited

U.S. PATENT DOCUMENTS

| | | | | |
|---|---|---|---|---|
| 5,426,395 | A * | 6/1995 | Cygan | H03F 1/52 330/207 P |
| 5,629,653 | A | 5/1997 | Stimson | |
| 5,832,374 | A * | 11/1998 | Birth | H03G 3/3042 455/127.2 |
| 6,553,212 | B1 * | 4/2003 | Wey | H04W 52/52 376/318 |
| 7,474,878 | B1 * | 1/2009 | Hietala | H03C 3/0925 375/294 |
| 8,755,756 | B1 * | 6/2014 | Zhang | H04B 1/109 455/114.2 |
| 2012/0088510 | A1 * | 4/2012 | Akhi | H03F 1/0261 455/450 |
| 2012/0270511 | A1 * | 10/2012 | Dakshinamurthy | H04B 17/13 455/115.1 |

FOREIGN PATENT DOCUMENTS

| | | |
|---|---|---|
| JP | H07-177045 | 7/1995 |
| JP | 2002-185410 | 6/2002 |
| JP | 2002-305477 | 10/2002 |
| JP | 2010-130207 | 6/2010 |
| JP | 2011-244272 | 12/2011 |
| WO | WO 01/33736 | 5/2001 |
| WO | WO 2010/114939 | 10/2010 |

OTHER PUBLICATIONS

Japanese Office Action for Application No. 2014-558158 dated Oct. 25, 2016.

* cited by examiner

HIGH-FREQUENCY TRANSMITTER, WIRELESS MICROPHONE AND GUITAR TRANSMITTER OR POCKET TRANSMITTER

The present application claims priority from PCT Patent Application No. PCT/EP2013/053995 filed on Feb. 28, 2013, which claims priority to German Patent Application No. DE 10 2012 203 026.3 filed on Feb. 28, 2012, the disclosures of which are incorporated herein by reference in their entirety.

FIELD OF THE INVENTION

The present invention concerns a high-frequency transmitter, a wireless microphone and a guitar transmitter or a pocket transmitter.

It is noted that citation or identification of any document in this application is not an admission that such document is available as prior art to the present invention.

High-frequency transmitters as are used for example in wireless microphones, wireless guitar transmitters or wireless pocket transmitters, typically have a high-frequency transmission output stage for the wireless transmission of HF radio signals for the transmission of audio signals.

FIG. 1 shows a schematic block circuit diagram of a high-frequency transmitter according to the state of the art. The high-frequency transmitter 500 has an input IN, an output OUT, a transmitter output stage or power amplifier 40 and an operating point regulating unit 20. The input signal of the adjustable attenuation member 10 represents the input signal IN. The output signal of the adjustable attenuation member 10 is coupled to the amplifier or the transmitter output stage 40. A transmission antenna 70 (or a plurality thereof) is provided at the output OUT. In that respect it can happen that radio signals (high-frequency signals) act on the transmitter output stage 40 by way of the transmission antenna 70 from a further transmission antenna 80 of an external high-frequency HF transmitter. That situation can occur if two or more mobile transmitters spatially approach each other or if for example a mobile transmitter is operated in the environment of a stationary transmitter (a mobile cell telephone, a TV transmitter or the like). The situation shown in FIG. 1 can lead to interactions with the high-frequency signal to be transmitted from the high-frequency transmitter 50 and thus can lead to resulting unwanted secondary emissions. That situation can be still further aggravated if the high-frequency transmitter 50 is operating in the battery mode and the transmitter output stage 40 is typically operated with a non-linear operating point to reduce the power consumption of the high-frequency transmitter 500.

To reduce unwanted secondary emissions the operating point power of the transmission transistor in the transmitter output stage 40 can be selected to be as high as possible. In particular the operating point power can be fixedly set, that is to say the operating point power is not variable. A change in the operating point power can be effected only in the context of compensation in respect of temperature and/or tolerance-induced fluctuations in the operating point power. It is possible in that way to ensure that the transmission transistor permanently has a high P1 dB compression point. Such a high P1 dB compression point results in low secondary emissions. On the other hand a permanently high P1 dB compression point suffers from the disadvantage of a high power demand. The high power demand in turn leads to a reduced operating time for a battery-powered transmitter.

U.S. Pat. No. 5,311,143 discloses a transmitter output stage with a directional coupler at the input or output. A part of the transmission power of the transmitter is coupled out and rectified by means of the directional coupler. The bias voltage of the transmitting transistor is altered in dependence on the dc voltage obtained by rectification. In other words the bias voltage is altered in dependence on the level of the specific transmitting output power.

GB 2369734 discloses an amplifier of a high-frequency HF transmitter. A directional coupler detects the output transmission power. The transmission power is detected by mixing of the transmission signal to a lower frequency instead of detection of the transmission power with a power detector at the transmission frequency. That is done as it is easier to measure the transmission power at lower frequencies.

In the German patent application from which priority is claimed the German Patent and Trade Mark Office searched the following documents: DE 103 40 808 A1, U.S. Pat. No. 5,420,552 and U.S. Pat. No. 5,629,653.

It is noted that in this disclosure and particularly in the claims and/or paragraphs, terms such as "comprises", "comprised", "comprising" and the like can have the meaning attributed to it in U.S. Patent law; e.g., they can mean "includes", "included", "including", and the like; and that terms such as "consisting essentially of" and "consists essentially of" have the meaning ascribed to them in U.S. Patent law, e.g., they allow for elements not explicitly recited, but exclude elements that are found in the prior art or that affect a basic or novel characteristic of the invention.

It is further noted that the invention does not intend to encompass within the scope of the invention any previously disclosed product, process of making the product or method of using the product, which meets the written description and enablement requirements of the USPTO (35 U.S.C. 112), such that applicant(s) reserve the right to disclaim, and hereby disclose a disclaimer of, any previously described product, method of making the product, or process of using the product.

SUMMARY OF THE INVENTION

An object of the present invention is to provide an improved high-frequency transmitter which both reduces the emission of unwanted secondary emissions and also reduces the power consumption of the transmitter.

Thus there is provided a high-frequency transmitter (for wireless microphones, guitar transmitters or pocket transmitters). The transmitter has at least one antenna, a power amplifier for amplifying a high-frequency HF signal to be transmitted, an interference signal detection unit for detecting an interference signal coupled in by way of the antenna, a power detector at the output of the interference signal detection unit for detecting the power of the interference signals detected by the interference signal detection unit and an operating point regulating unit for adjusting the operating point power of the power amplifier in dependence on the interference power coupled in by way of the antenna. Adjustment of the operating point power can be effected for example by adjustment of the bias and/or the drain or collector voltage of a transmission transistor contained in the transmission output stage.

According an aspect of the invention the interference signal detection unit has a directional coupler between the output of the power amplifier and an output of the transmitter for detection of the interference power coupled in by way of the transmitting antenna.

According to a further aspect of the present invention the interference signal detection unit has a mixer for mixing an input signal and an output signal of the power amplifier. The output signal of the power amplifier also has the interference power coupled in by way of the transmission antenna. The output signal of the mixer contains the interference power coupled in by the transmission antenna.

According to a further aspect of the present invention the operating point regulating unit is adapted to increase the operating point power of the power amplifier when the interference power coupled in by way of the antenna exceeds a threshold value and to reduce the operating point power when the interference power falls below a threshold value.

According to a further aspect of the invention the operating point regulating unit is adapted to adjust the operating point power of the power amplifier in dependence on the interference power coupled in by way of the antenna, wherein the operating point power is increased with rising interference power and reduced with falling interference power.

According to a further aspect of the present invention adjustment of the operating point power of the power transformer is effected in various steps or steplessly.

According to a further aspect of the invention the transmitter has an adjustable attenuation member between the input of the transmitter and the input of the power amplifier for controlling the input power of the power amplifier in dependence on the interference power detected by the power detector.

The power amplifier receives an input signal IN. The frequency of that signal is preferably in the high-frequency HF range. For the transmission of a useful signal the input signal IN can represent a modulated high-frequency HF signal. In that case the useful signal to be transmitted is used for modulation of a high-frequency HF signal before it is fed to the power amplifier as the input signal IN. The useful signal can represent for example an audio signal. Alternatively it can for example comprise digitally encoded information or represent a TV signal. Further kinds of useful signal are contained in the region of application of the present invention.

The invention also concerns a method of transmitting high-frequency signals. A high-frequency signal to be transmitted is amplified in a power amplifier. An external interference signal which is coupled in by way of an antenna (that is to say an interference signal from an external high-frequency transmitter) is detected by an interference signal detection unit. The power of the interference signals detected by the interference signal detection unit is detected by a power detector. The operating point power of the power amplifier is adjusted in dependence on the power of the interference signals, that is detected by the power detector, by an operating point regulating unit.

The invention is based on the concept of implementing dynamic regulation of the operating point power (current and voltage) and thus the P1 dB compression point in dependence on the level or the power of the external high-frequency signals which are coupled in at the antenna (interference signals). In that respect it is provided according to the invention that high coupled-in extraneous high-frequency signals (that is to say with a high power) lead to a high operating point power and low coupled-in extraneous high-frequency signals lead to a low operating point power. In that respect it is assumed that a high level of operating point power leads to increased linearity of the transmitter output stage (power amplifier 40) and thus to a reduction in secondary emissions.

The invention concerns the notion of providing a high-frequency HF transmitter for example for wireless microphones, wireless guitar transmitters or wireless pocket transmitters, wherein the high-frequency HF transmitter has an amplifier with adjustable operating points. It is optionally possible to provide between the amplifier and an antenna a directional coupler which does not detect the output signals that are to be transmitted of the amplifier but the interference received or coupled in by way of the antenna from other external high-frequency HF transmitters in the proximity and adjusts the operating point of the amplifier or the operating point power of the amplifier, based on those signals. If the interference received or coupled in by the antenna is no longer present then the operating point power can be reduced again, which has a positive effect in regard to the power consumption of the high-frequency HF transmitter. By virtue of that dynamic adjustment of the transmitter operating point, a maximum operating point power is set only when high levels of interference power are coupled in or received by way of the antenna. If those interference powers are no longer present then the operating point power can be reduced.

DETAILED DESCRIPTION OF EMBODIMENTS

It is to be understood that the figures and descriptions of the present invention have been simplified to illustrate elements that are relevant for a clear understanding of the present invention, while eliminating, for purposes of clarity, many other elements which are conventional in this art. Those of ordinary skill in the art will recognize that other elements are desirable for implementing the present invention. However, because such elements are well known in the art, and because they do not facilitate a better understanding of the present invention, a discussion of such elements is not provided herein.

The present invention will now be described in detail on the basis of exemplary embodiments.

Figure 1:
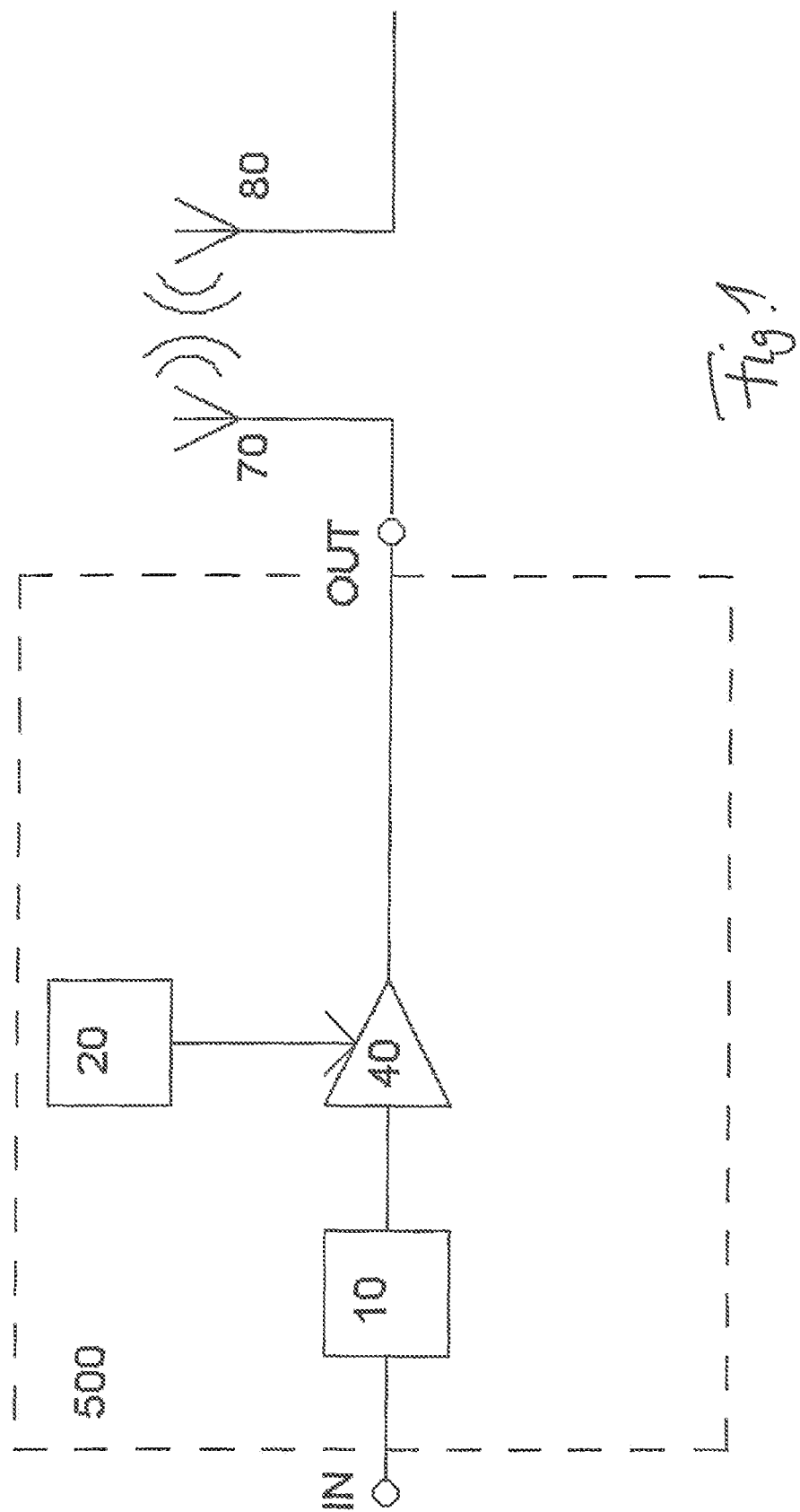
FIG. 1 shows a schematic block circuit diagram of a wireless transmitter according to the state of the art.
Figure 2:
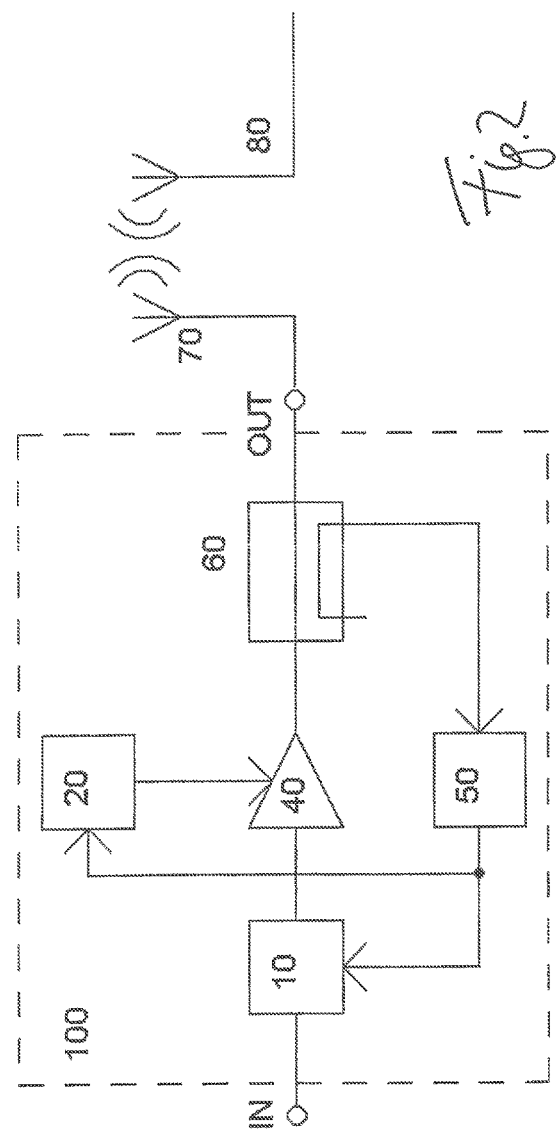
FIG. 2 shows a schematic block circuit diagram of a high-frequency HF transmitter according to a first embodiment.

FIG. 2 shows a schematic block circuit diagram of a high-frequency HF transmitter according to a first embodiment. At its input IN the high-frequency transmitter 100 has an adjustable attenuation member (or an adjustable amplifier) 10, a power amplifier (transmitter output stage) 40, an operating point regulating unit 20, optionally a directional coupler 60 at the output of the power amplifier 40 and a power detector 50 at the output of the directional coupler 60. The output of the power detector 50 is coupled to the adjustable attenuation member 10 and the operating point regulating unit 20. The output of the power amplifier 40 is coupled to a transmitting antenna 70.

The directional coupler 60 is so designed that it does not detect the output signal to be transmitted (that is to say the output signals) of the power amplifier 40, but those interference signals (high-frequency HF signals from extraneous high-frequency HF transmitters), that are received or coupled in by the antenna 70. The interference power coupled in by the antenna 70 (that is to say external high-frequency HF signals which are coupled in by the antenna and which have been produced for example by other high-frequency HF transmitters in the proximity) is coupled out by means of the directional coupler 60 and detected by the power detector 50. The operating point power of the power amplifier 40 is adjusted in dependence on the level of the interference power detected by the power detector 50. That is effected by the operating point regulating unit 20. The adjustable attenuation member or the adjustable amplifier 10 serves to keep the output power of the power amplifier 40 constant. That is effected by the input power of the power amplifier 40 being adjusted by the adjustable attenuation member 10.

According to the invention the directional coupler 60 detects the interference power or the signal which is coupled in by the transmitting antenna 70. Accordingly the directional coupler 60 does not detect the output signal of the power amplifier 40, that is to be transmitted. In addition the interference power coupled in by the antenna 70 (coupled-in external high-frequency HF signals) is thus detected by means of the directional coupler 60 and the power detector 50 and passed to the operating point regulating unit 20. Based on the detected interference power (which was coupled into the antenna 70) the operating point power of the power amplifier 40 is adjusted. The operating point of the power amplifier 40 can be adjusted by the adjustment of the operating point power.

By virtue of the fact that the interference power which is actually detected or coupled in can be detected by means of the directional coupler 60 and the power detector 50 the operating point can be adapted by way of the operating point regulating unit 20 for the duration of the occurrence of the interference power (the operating point power can be increased). The linearity of the power amplifier can also be increased by an increased operating point power. Thus a 1 dB compression point (P1 dB) of the power amplifier 40 can be dynamically adjusted in dependence on the coupled-in interference power.

So that the overall gain of the power amplifier can also be kept constant by way of a variable operating point power the input power of the amplifier can be adjusted by means of the adjustable attenuation member 10 in dependence on the coupled-in interference power.

By virtue of the high-frequency HF transmitter according to the invention it is possible to avoid secondary emissions by virtue of spatial proximity of a plurality of wireless transmitters relative to each other and the power amplifier 40 can be operated in highly linear fashion by the provision of operating point adjustment by an increase in the operating point power. As the increase in linearity involves an increased power demand that increase in linearity of the power amplifier 40 occurs only when the interference power which is coupled in by the antenna exceeds a threshold value. As an alternative thereto the power can be (automatically) adjusted steplessly in dependence on the level of the coupled-in interference power.

A permanent increase in the operating point power is unwanted in particular in relation to mobile and battery-operated devices. Therefore, it is necessary to weigh up between the increased linearity of the power amplifier 40 and the increased operating point power so that the increased operating point power is provided only when it is also actually required.

Figure 3:
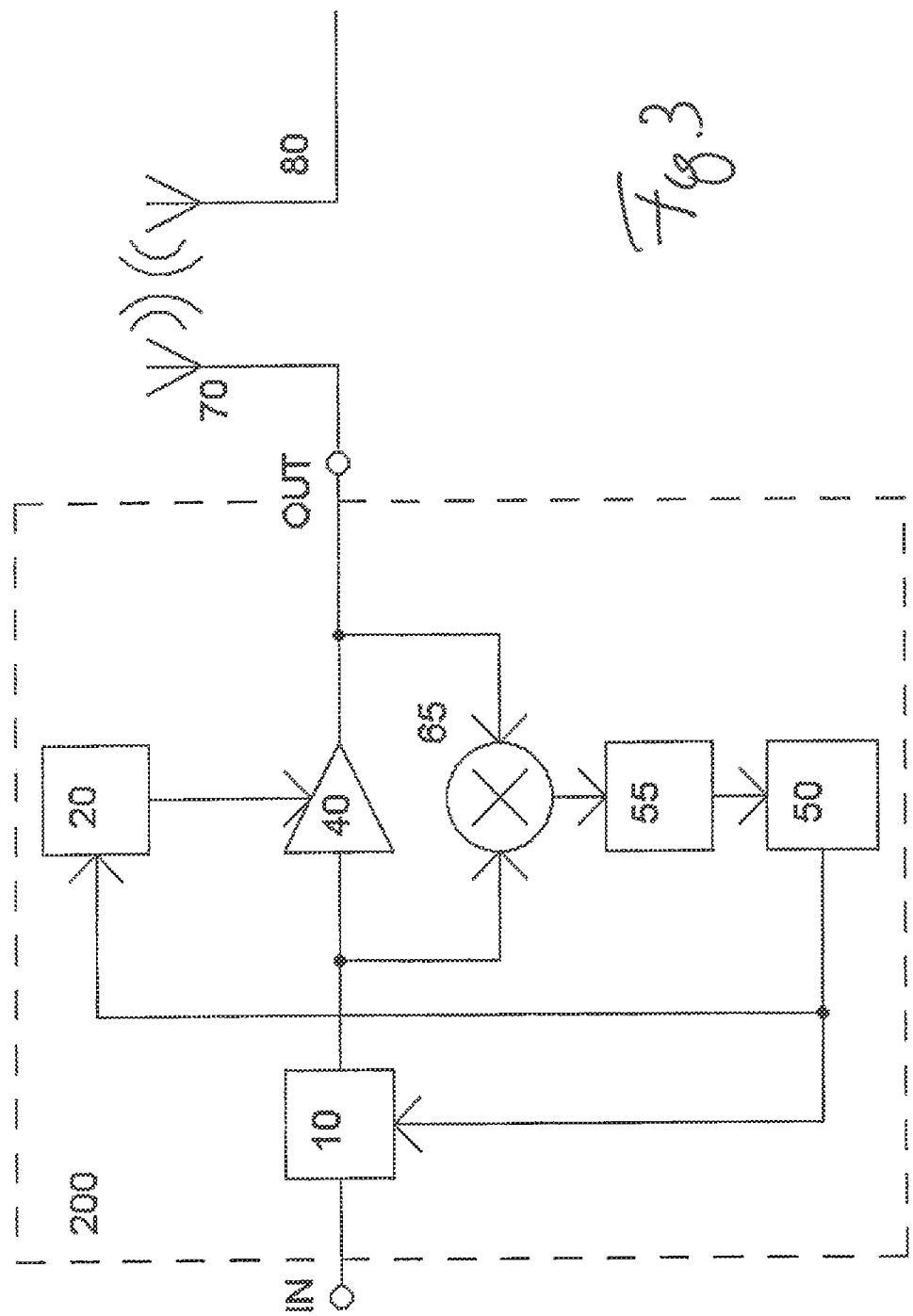
FIG. 3 shows a schematic block circuit diagram of a high-frequency HF transmitter according to a second embodiment.

FIG. 3 shows a schematic block circuit diagram of a high-frequency HF transmitter in accordance with a second embodiment. At its input IN the high-frequency HF transmitter 200 has an adjustable attenuation member 10, a power amplifier 40, an operating point regulating unit 20, a mixer 65 in parallel relationship with the power amplifier 40 and a power detector 50. The output of the adjustable attenuation member 10 is coupled to the input of the power amplifier 40. The output of the adjustable attenuation member 10 and the output of the power amplifier 40 are coupled to the mixer 65. The output signal of the mixer 65 can be filtered by a band pass filter 55. The output signal of the power detector 50 can optionally be passed to the adjustable attenuation member 10 and the operating point regulating unit 20.

The extraneous high-frequency power which is coupled in by way of the antenna 70 is fed together with a transmission signal to the mixer 65 and mixed with the non-amplified transmission signal. The extraneous high-frequency signal is mixed into the baseband by mixing in the mixer 65. The products at the sum and difference frequencies can be removed with the band pass filter 55. The extraneous high-frequency signal mixed into the baseband is fed to the power detector 50 which produces a dc voltage in dependence on the extraneous high-frequency power. The operating point power is adjusted by the operating point regulating unit 20 in dependence on the level of that dc voltage. A change in the gain of the transmission transistor, which occurs due to the variation in the operating point power, can be compensated by the attenuation member 10.

A pure interference signal can be obtained by mixing in the mixer 65. The operating point power of the power amplifier 40 is adjusted in dependence on the level of the interference power and in particular by the operating point regulating unit 20. The input power is adjusted by means of the adjustable attenuation member 10 to be able to keep the output power constant.

Figure 4:
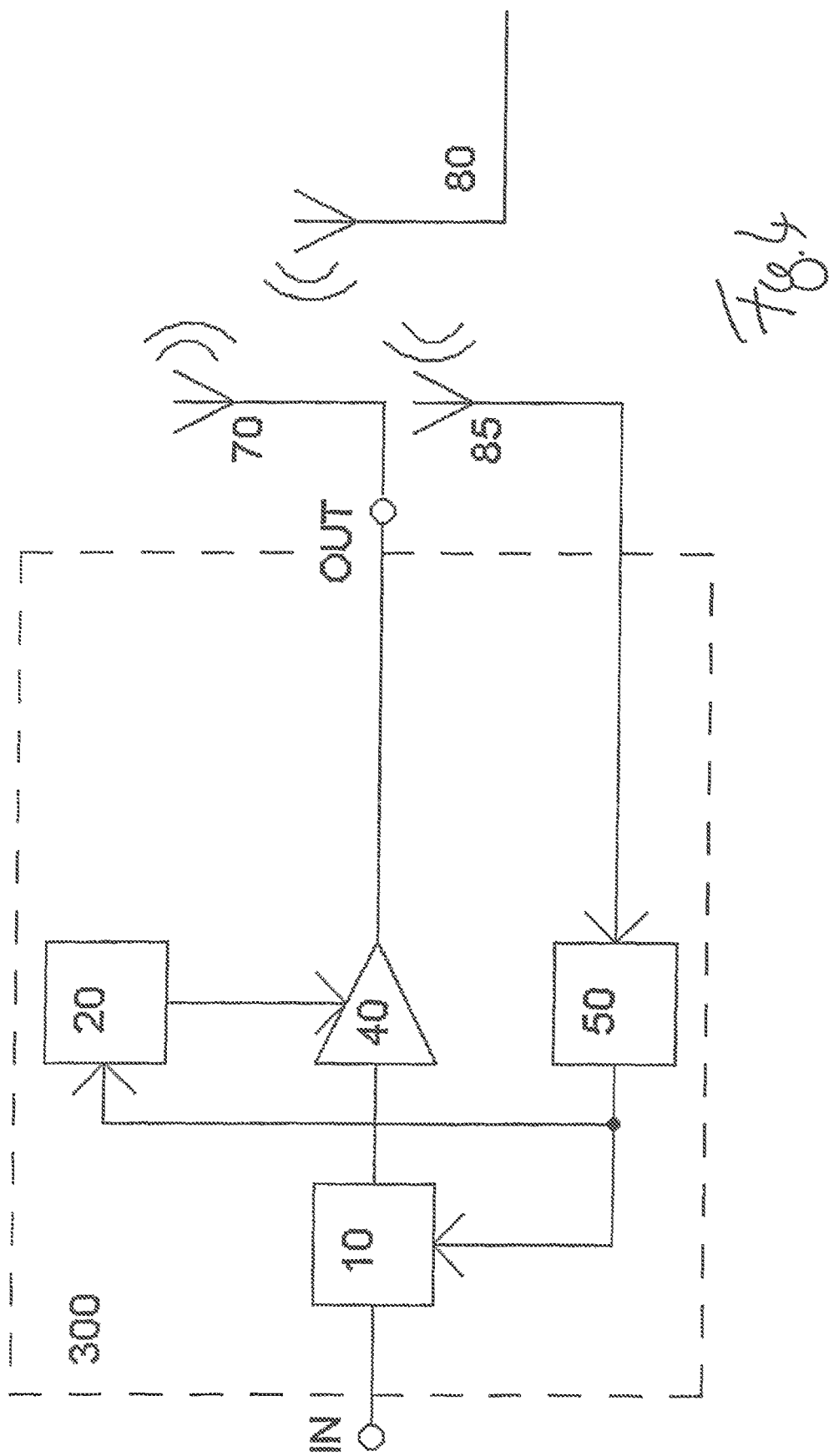
FIG. 4 shows a schematic block circuit diagram of a high-frequency HF transmitter according to a third embodiment.

FIG. 4 shows a schematic block circuit diagram of a high-frequency HF transmitter in accordance with a third embodiment. The high-frequency HF transmitter in accordance with the third embodiment can be based on a high-frequency HF transmitter according to the first or the second embodiment. The high-frequency HF transmitter 300 has an input IN, an adjustable attenuation member 10, a power amplifier 40, an operating point regulating unit 20, a transmitting antenna 70 and a receiving antenna 85. The receiving antenna 85 can be coupled to a power detector 50. The output of the power detector 50 can be coupled to the adjustable attenuation member 10 and to the operating point regulating unit 20. In contrast to the high-frequency HF transmitter in accordance with the first and second embodiments, the output signal of the antenna 70 is not used as the basis for detection of an interference power. Rather, the antenna 85 is used as a receiving antenna and the interference signals which in that case are coupled in are passed to the power detector 50 which can then correspondingly ascertain the respective power of the received extraneous high-frequency HF signal. Adjustment of the operating point power of the transmission output stage 40 is then effected as described in the first and second embodiments.

Figure 5:
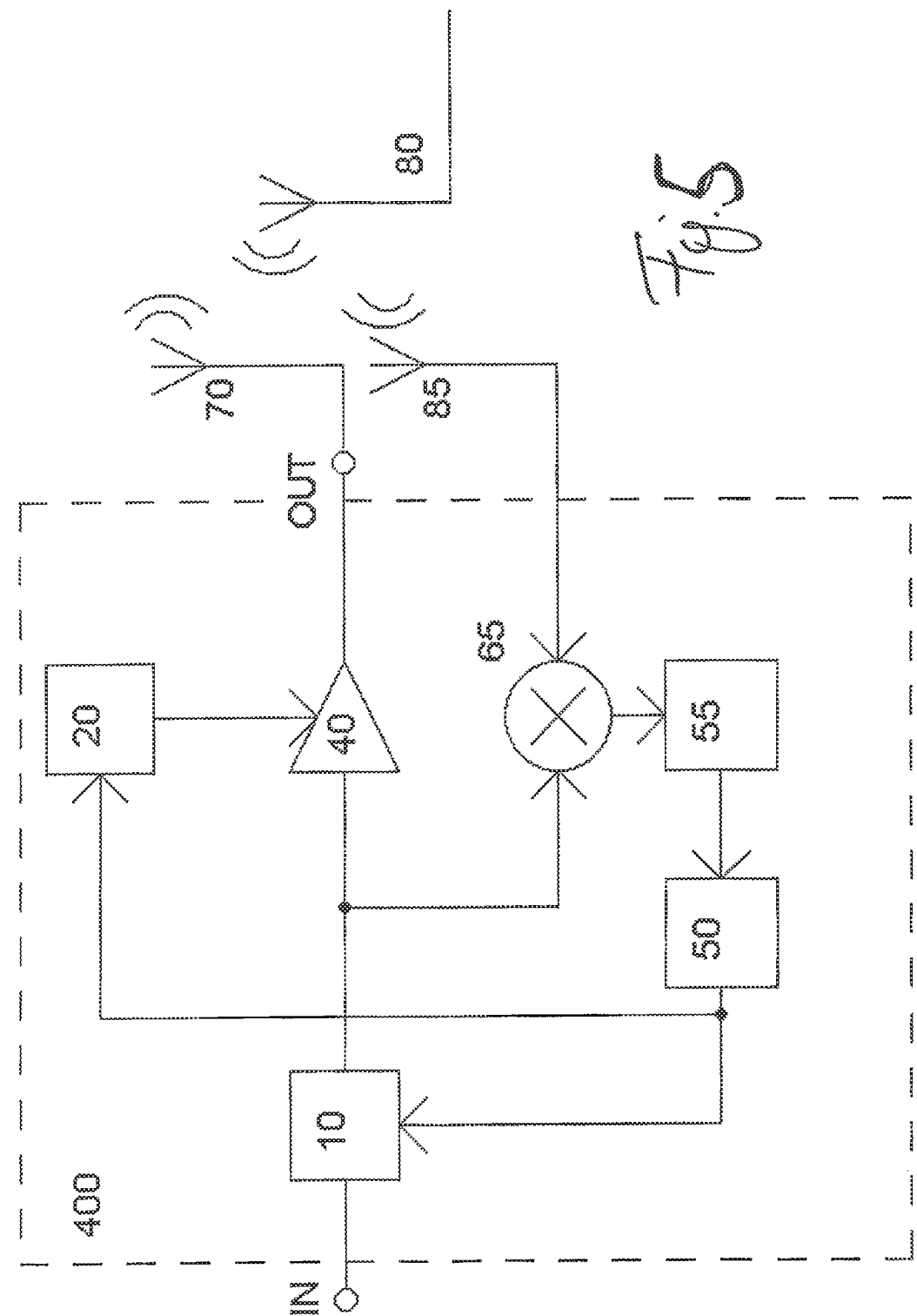
FIG. 5 shows a schematic block circuit diagram of a high-frequency HF transmitter according to a fourth embodiment.

FIG. 5 shows a schematic block circuit diagram of a high-frequency HF transmitter in accordance with a fourth embodiment. The high-frequency HF transmitter in accordance with the fourth embodiment can be based on the high-frequency HF transmitter in accordance with the second or third embodiment. As in the case of the high-frequency HF transmitter in accordance with the third embodiment there is a receiving antenna 85 in addition to the transmitting antenna 70. A mixer 65 is coupled to the input of the power amplifier 40 and to the receiving antenna 85 to provide for mixing of the two signals. The output of the mixer 65 is optionally passed to a band pass filter 55. The output signal of the band pass filter 55 is then passed to the power detector 50.

With the high-frequency HF transmitter according to the second and fourth embodiments the extraneous high-frequency power coupled in by way of an antenna 70, 85 (interference power) is fed to the mixer 65 together with the actual transmission signal and mixed with the non-amplified transmission signal. The extraneous high-frequency signal is mixed into the baseband by the mixing operation. The products at the sum frequency and the difference frequency can be removed by the band pass filter 55. The extraneous high-frequency signal mixed into the baseband is fed to the power detector 50 which produces a dc voltage in dependence on the extraneous high-frequency power (interference power). In dependence on the level of the dc voltage the operating point power is adjusted by the operating point regulating unit 20. If changes in gain occur that can be compensated by the attenuation member 10.

With the high-frequency HF transmitter according to the third embodiment of FIG. 4 it is possible to dispense with the directional coupler 60 by the provision of the further receiving antenna 85.

Figure 6:
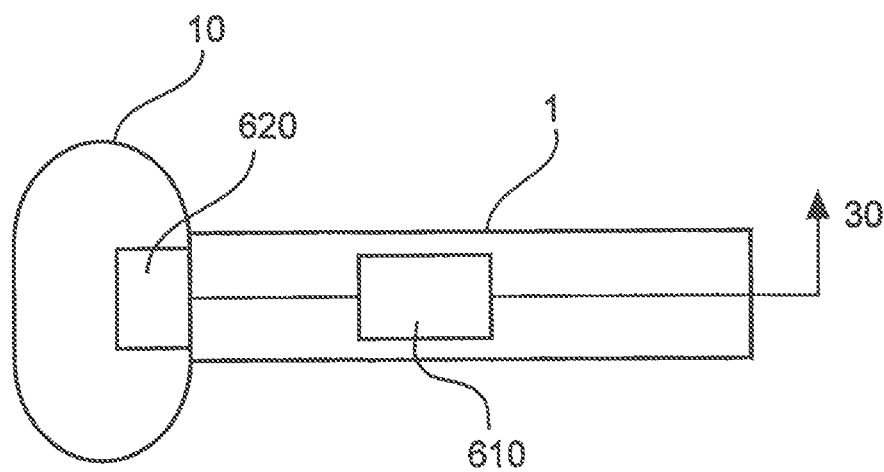
FIG. 6 shows a diagrammatic view of a wireless microphone according to a fifth embodiment.

FIG. 6 shows a schematic view of a wireless microphone in accordance with a fifth embodiment. The wireless microphone 1 has a microphone capsule 620 for the detection of audio signals for example in a microphone head 1*a*. In addition the wireless microphone has a wireless transmitter 610, for example a high-frequency HF transmitter according to the first embodiment. The output of the wireless transmitter 610 is coupled to an antenna 30. The wireless transmitter 610 in accordance with the fifth embodiment is based on a high-frequency HF transmitter in accordance with the first, second, third or fourth embodiment.

Figure 7:
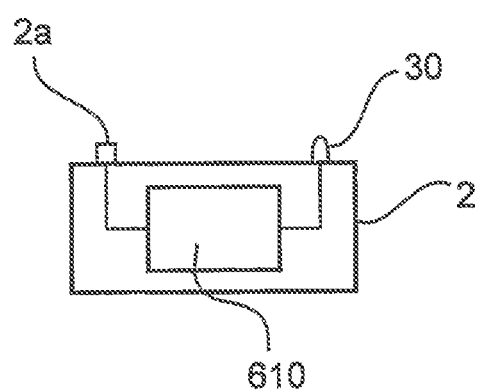
FIG. 7 shows a schematic block circuit diagram of a guitar transmitter or pocket transmitter according to a sixth embodiment.

FIG. 7 shows a schematic view of a wireless guitar transmitter or a wireless pocket transmitter in accordance with a sixth embodiment. The wireless guitar transmitter or the wireless pocket transmitter 2 has an audio input 2*a*, an antenna 30 and a wireless transmitter 610. The high-frequency HF transmitter 610 in accordance with the sixth embodiment corresponds in this case to the high-frequency HF transmitter in accordance with the first, second, third or fourth embodiment. For example a microphone or a musical instrument like for example a guitar can be connected to the audio input 2*a*. The audio signals received by the audio input 2*a* are wirelessly transmitted by way of the high-frequency HF transmitter 610 and the transmitting antenna 30.

Figure 8:
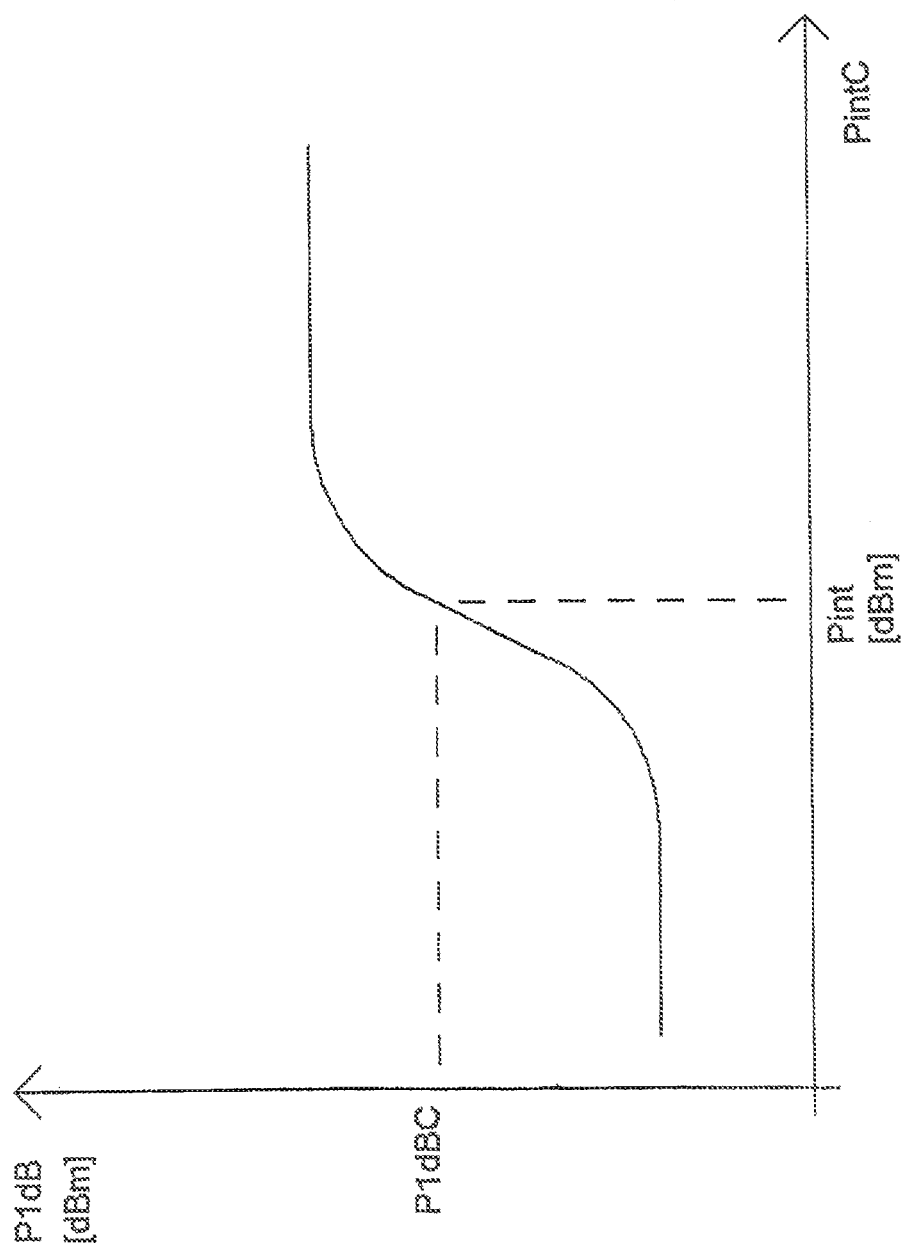
FIG. 8 shows a graph to illustrate adaptation of the 1 dB compression point in dependence on an interference power.

FIG. 8 shows a diagrammatic view of adaptation of the 1 dB compression point of the power amplifier 40 at various interference power levels. FIG. 8 shows in particular the relationship between the coupled-in extraneous high-frequency power and the P1 dB compression point of the transmission output stage.

Figure 9:
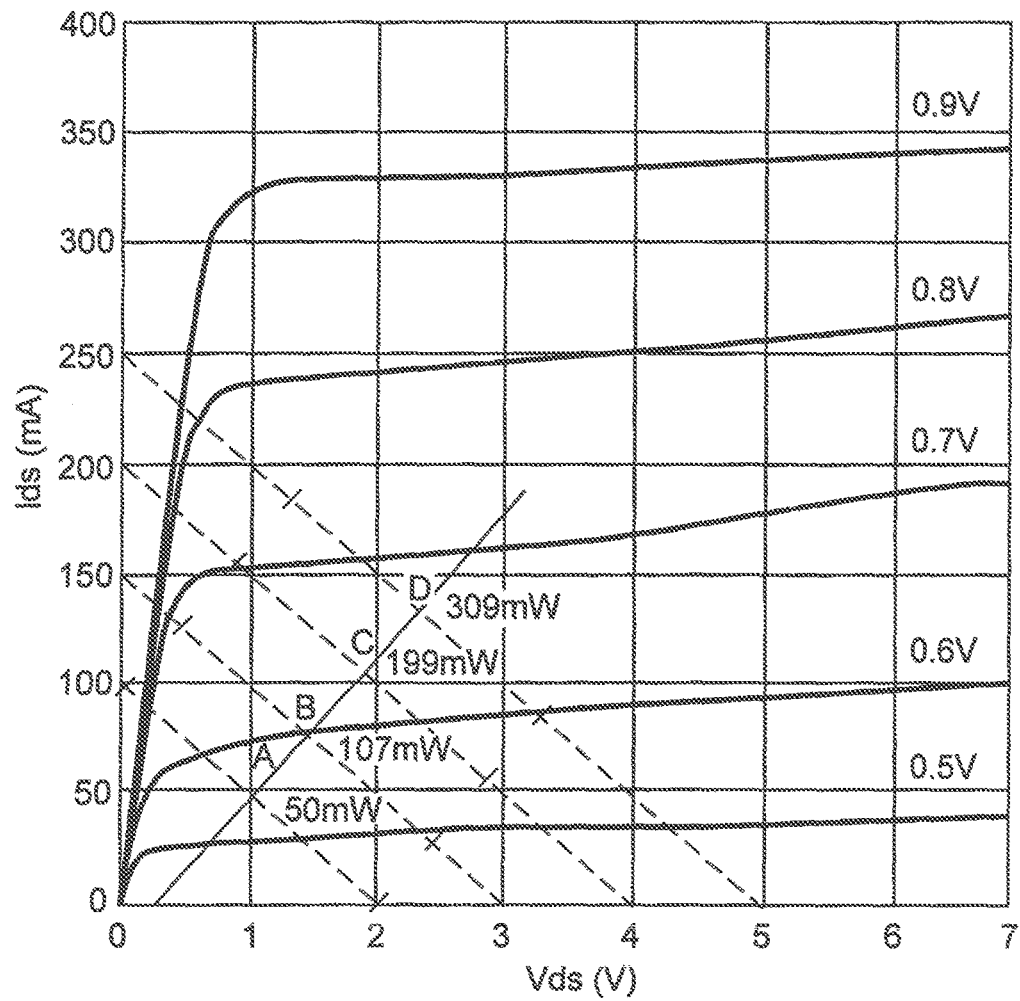
FIG. 9 shows a graph of various output characteristic curve families of a transistor in the wireless transmitter of FIG. 2 through 5.

FIG. 9 shows a graph representing various output characteristic curve families of a transistor in the transmitter as shown in FIGS. 2 through 5. FIG. 9 shows in graph form the drain-source voltage Uds and the drain-source current Ids. The Figure further shows various operating points A-D of the power amplifier 40 with a constant output power at a constant load resistance. The operating point A, B, C or D is selected in accordance with the level of the interference power coupled in by the antenna 70. By virtue of the shift in the operating points the 1 dB compression point of the power amplifier 40 is displaced, in which case the output power of the power amplifier 40 can remain constant.

FIG. 9 also shows various load straight lines with a constant load impedance. If the output power is constant then the operating point power of the transmitter of the transmission output stage is adjusted in accordance with the level of the detected interference power (detected extraneous high-frequency power). If in the case of the change in the operating point power there is a change in the gain of the power amplifier 40 or the transmitting transistor then that can be compensated by the adjustable attenuation member 10.

Figure 10:
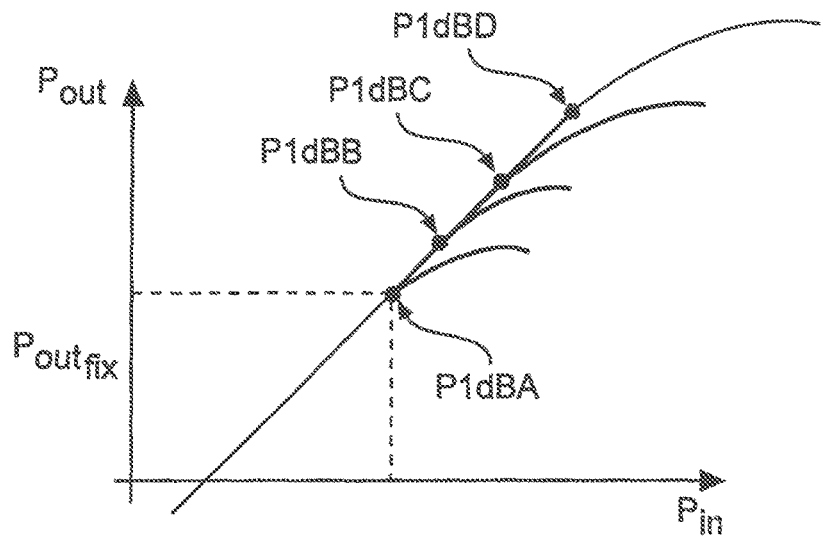
FIG. 10 shows a graph to illustrate various operating points of a transmitter output stage.

FIG. 10 shows a graph to illustrate various operating points of a transmission output stage according to the invention. In particular the Figure shows various operating points of the transmitting transistor with a constant output power at a constant load resistance. When a coupled-in interference power is present the operating point can be adjusted or shifted from A towards D (by way of B and C). In that case such adjustment is effected in accordance with the level of the measured or coupled-in interference power. The P1 dB compression point of the transmission output stage is shifted by such a shift in the operating points A-D. In that case the output power remains constant.

The high-frequency transmitter according to the invention can be used for example in a wireless microphone, a wireless guitar transmitter or a wireless pocket transmitter.

While this invention has been described in conjunction with the specific embodiments outlined above, it is evident that many alternatives, modifications, and variations will be apparent to those skilled in the art. Accordingly, the preferred embodiments of the invention as set forth above are intended to be illustrative, not limiting. Various changes may be made without departing from the spirit and scope of the inventions as defined in the following claims.

The invention claimed is:

1. A high-frequency transmitter comprising:
at least one transmission antenna;
a power amplifier that amplifies a high-frequency signal to be transmitted;
an interference signal detection circuit configured to detect an external interference signal which is coupled in by way of the transmission antenna;
a power detection circuit that detects the power of the interference signal detected by the interference signal detection circuit; and
an operating point regulating circuit that adjusts an operating point power of the power amplifier, in dependence on the power of the external interference signal, that is detected by the power detection circuit.

2. A transmitter as set forth in claim 1; wherein the interference signal detection circuit has a directional coupler between an output of the power amplifier and an output of the transmitter for detection of the external interference signal which are coupled in by way of the transmission antenna.

3. A transmitter as set forth in claim 1; wherein the interference signal detection circuit has a mixer configured to mix the input signal of the power amplifier and an external interference signal which is coupled in by way of the transmission antenna;
   wherein the mixer mixes the interference signal into a baseband position; and
   wherein an output signal of the mixer contains the external interference signal coupled in by way of the transmission antenna in the baseband position.

4. A transmitter as set forth in claim 1; wherein the operating point regulating circuit is adapted to:
   increase the operating point power of the power amplifier when the power of the external interference signal coupled in by way of the transmission antenna exceeds a threshold value; and
   reduce the operating point power when the power of the external interference signal falls below a threshold value.

5. A transmitter as set forth in claim 1; wherein the operating point regulating circuit is adapted to adjust the operating point power of the power amplifier in dependence on the power of the external interference signal coupled in by way of the transmission antenna, so that the operating point power is increased with rising interference power and reduced with falling interference power.

6. A transmitter as set forth in claim 5; wherein the operating point regulating circuit is adapted to steplessly adjust the operating point power of the power amplifier.

7. A transmitter as set forth in claim 1, further comprising:
   an adjustable attenuation member, an adjustable amplifier, or a combination thereof upstream of the input of the power amplifier configured to control the input power of the power amplifier in dependence on the power of the external interference signal power detected by the power detecting circuit.

8. A wireless microphone, guitar transmitter or pocket transmitter comprising:
   a high-frequency transmitter as set forth in claim 1.

9. A method of transmitting a high-frequency signal comprising the steps:
   amplifying a high-frequency signal to be transmitted by a power amplifier;
   detecting an external interference signal which is coupled in by way of a transmission antenna by an interference signal detection circuit;
   detecting a power of the external interference signal detected by the interference signal detection circuit; and
   adjusting an operating point power of the power amplifier in dependence on the power of the external interference signal, that is detected by a power detecting circuit.

* * * * *

UNITED STATES PATENT AND TRADEMARK OFFICE
CERTIFICATE OF CORRECTION

PATENT NO. : 9,762,194 B2
APPLICATION NO. : 14/380296
DATED : September 12, 2017
INVENTOR(S) : Mathias Kleinsorge et al.

It is certified that error appears in the above-identified patent and that said Letters Patent is hereby corrected as shown below:

In the Claims

Column 10, Line 6 of Claim 7 to read --signal detected by power detecting circuit-- instead of "signal power detected by power detecting circuit".

Signed and Sealed this
Twenty-fourth Day of April, 2018

Andrei Iancu
*Director of the United States Patent and Trademark Office*